United States Patent
Lee

(10) Patent No.: US 9,160,335 B2
(45) Date of Patent: Oct. 13, 2015

(54) SEMICONDUCTOR APPARATUS AND REDUCED CURRENT AND POWER CONSUMPTION

(71) Applicant: SK hynix Inc., Icheon-si Gyeonggi-do (KR)

(72) Inventor: Hyun Woo Lee, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/190,372

(22) Filed: Feb. 26, 2014

(65) Prior Publication Data

US 2015/0155869 A1  Jun. 4, 2015

(30) Foreign Application Priority Data

Dec. 3, 2013  (KR) .......................... 10-2013-0149073

(51) Int. Cl.
| | |
|---|---|
| H04L 1/00 | (2006.01) |
| H03K 19/00 | (2006.01) |
| H03K 3/012 | (2006.01) |
| H03K 3/356 | (2006.01) |
| H03K 19/094 | (2006.01) |

(52) U.S. Cl.
CPC ............ *H03K 19/0013* (2013.01); *H03K 3/012* (2013.01); *H03K 3/356034* (2013.01); *H03K 19/09436* (2013.01)

(58) Field of Classification Search
None
See application file for complete search history.

(56) References Cited

U.S. PATENT DOCUMENTS

| | | | | |
|---|---|---|---|---|
| 4,472,647 | A | * | 9/1984 | Allgood et al. ................ 326/65 |
| 5,600,267 | A | * | 2/1997 | Wong et al. .................... 326/73 |
| 5,880,599 | A | * | 3/1999 | Bruno ............................. 326/56 |
| 6,404,223 | B1 | * | 6/2002 | Degerstrom et al. .......... 326/30 |
| 7,372,295 | B1 | * | 5/2008 | Wei ................................ 326/30 |
| 7,468,615 | B1 | * | 12/2008 | Tan et al. ....................... 326/68 |
| 7,564,264 | B1 | * | 7/2009 | Morrison et al. .............. 326/68 |
| 7,710,190 | B2 | * | 5/2010 | Oberhuber .................... 327/512 |
| 7,872,495 | B1 | * | 1/2011 | Tran et al. ..................... 326/30 |
| 8,013,768 | B2 | * | 9/2011 | Jantzi et al. ................... 341/144 |
| 2002/0000834 | A1 | * | 1/2002 | Ooishi .......................... 326/113 |
| 2003/0141895 | A1 | * | 7/2003 | Ramaswamy ................. 326/30 |
| 2005/0030063 | A1 | * | 2/2005 | Ritchie et al. ................. 326/73 |
| 2006/0159200 | A1 | * | 7/2006 | Hsu et al. ..................... 375/316 |
| 2007/0096797 | A1 | * | 5/2007 | Camara et al. ............... 327/540 |
| 2007/0103195 | A1 | * | 5/2007 | Duk-Sohn et al. ............ 326/41 |
| 2009/0172614 | A1 | * | 7/2009 | Camara et al. ................ 716/5 |
| 2013/0076394 | A1 | * | 3/2013 | Catli et al. .................... 326/68 |

FOREIGN PATENT DOCUMENTS

| | | |
|---|---|---|
| KR | 1020090126941 A | 12/2009 |
| KR | 1020100050882 A | 5/2010 |

* cited by examiner

*Primary Examiner* — Crystal L Hammond
(74) *Attorney, Agent, or Firm* — William Park Associates Ltd.

(57) ABSTRACT

A semiconductor apparatus may include a mode control circuit configured to output differential output signals which swing in a current mode logic (CML) area and a first control signal, in response to a power-down mode signal; a first circuit unit configured to be provided with the differential output signals, and operate in a power-down mode; and a second circuit unit configured to be provided with the differential output signals, and be interrupted in its operation in the power-down mode.

5 Claims, 5 Drawing Sheets

SEMICONDUCTOR APPARATUS AND REDUCED CURRENT AND POWER CONSUMPTION

CROSS-REFERENCES TO RELATED APPLICATION

The present application claims priority under 35 U.S.C. §119(a) to Korean application number 10-2013-0149073, filed on Dec. 3, 2013, in the Korean Intellectual Property Office, which is incorporated herein by reference in its entirety.

BACKGROUND

1. Technical Field

Various embodiments relate to an integrated circuit apparatus, and more particularly, to a semiconductor apparatus.

2. Related Art

In a semiconductor apparatus, signals with various frequencies are used. A signal with a high frequency, such as a clock signal, is generated and divided using a current mode logic (CML) circuit.

A CML circuit is a circuit which outputs a signal swinging with a predetermined frequency between a highest potential level and a lowest potential level in a CML area as a potential level area of a preset range.

A semiconductor apparatus is required to operate with low power consumption, and a clock gating scheme may be taken as one of low power consumption circuit design techniques. The clock gating scheme is a scheme of interrupting a generation of a clock signal according to a mode of a semiconductor apparatus, and is devised to prevent unnecessary power consumption. However, because a circuit unit which continuously uses a clock signal even in a power-down mode exists in a semiconductor apparatus, it is difficult to apply the clock gating scheme in the power-down mode.

FIG. 1 is a configuration diagram of a conventional semiconductor apparatus.

Referring to FIG. 1, a semiconductor apparatus 1 may include a CML circuit unit 11, a first circuit unit 12, a second circuit unit 13, and a control signal generation unit 14.

The CML circuit unit 11 generates differential output signals OUT and OUTB which swing in a CML area, in response to an operation enable signal EN and complementary input signals IN and INB; and provides the differential output signals OUT and OUTB to the first circuit unit 12 and the second circuit unit 13.

The first circuit unit 12 performs an already-designed operation in response to the differential output signals OUT and OUTB of the CML circuit unit 11. In particular, the first circuit unit 12 may be a circuit unit which continuously operates even in a power-down mode and is thus provided with the output signals of the CML circuit unit 11.

The second circuit unit 13 performs an already-designed operation in response to the differential output signals OUT and OUTB of the CML circuit unit 11. The second circuit unit 13 may be a circuit unit of which operation is interrupted in the power-down mode. Accordingly, the second circuit unit 13 does not necessitate the differential output signals OUT and OUTB of the CML circuit unit 11 in the power-down mode.

The control signal generation unit 14 generates a power-down enable signal PD in response to the operation enable signal EN and a power-down mode signal PWDN. The control signal generation unit 14 may be configured, for example, as shown in FIG. 2.

The control signal generation unit 14 shown in FIG. 2 includes an element L11 which generates the power-down enable signal PD of a high level when at least one of the operation enable signal EN and an inverted signal of the power-down mode signal PWDN is enabled, according to a combination of the two signals. Accordingly, the second circuit unit 13 may be interrupted to operate, by the power-down enable signal PD in the power-down mode.

In this manner, although the operation of the second circuit unit 13 may be interrupted in the power-down mode, since the first circuit unit 12 which continuously needs the differential output signals OUT and OUTB of the CML circuit unit 11 exists, the CML circuit unit 11 should also continuously operate in the power-down mode.

The CML circuit unit 11 has advantages in that it has a small swing level, is superior in characteristics with respect to noise and is easy to design.

However, a certain amount of current is consumed regardless of the frequencies of input signals. Accordingly, the same amount of current cannot help but be always consumed even in the power-down mode, as in a normal mode.

SUMMARY

In an embodiment, a semiconductor apparatus may include: a mode control circuit configured to output differential output signals which swing in a current mode logic (CML) area and a first control signal, in response to a power-down mode signal; a first circuit unit configured to be provided with the differential output signals, and operate in a power-down mode; and a second circuit unit configured to be provided with the differential output signals, and be interrupted in its operation in the power-down mode.

In an embodiment, a semiconductor apparatus may include: a control signal generation unit configured to output a first control signal and a second control signal in response to a power-down mode signal; and a CML circuit unit configured to generate first and second output signals which swing in a current mode logic (CML) area, as differential output signals, in response to the second control signal.

In an embodiment, a system comprises: a processor; a controller configured to receive a request and a data from the processor; and a memory unit configured to receive the request and the data from the controller, wherein the memory unit includes: a mode control circuit configured to output differential output signals which swing in a current mode logic (CML) area and a first control signal, in response to a power-down mode signal; a first circuit unit configured to be provided with the differential output signals, and operate in a power-down mode; and a second circuit unit configured to be provided with the differential output signals, and be interrupted in its operation in the power-down mode.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according will be described with reference to the accompanying drawings through various embodiments.

Figure 1:
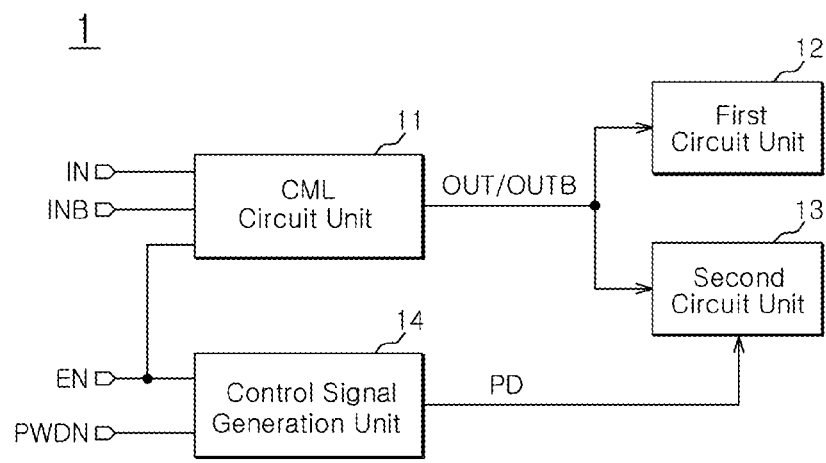
FIG. 1 is a configuration diagram of a conventional semiconductor apparatus.
Figure 2:
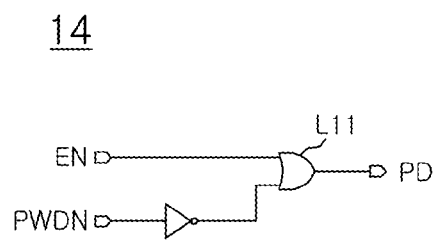
FIG. 2 is an exemplary diagram of the control signal generation unit shown in FIG. 1.
Figure 3:
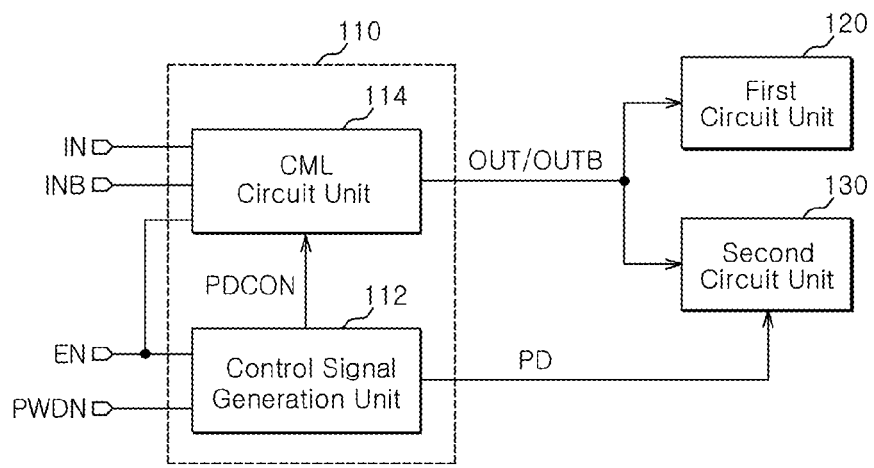
FIG. 3 is a configuration diagram of a semiconductor apparatus in accordance with an embodiment.

FIG. 3 is a configuration diagram of a semiconductor apparatus in accordance with an embodiment.

Referring to FIG. 3, a semiconductor apparatus 100 in accordance with an embodiment includes a mode control circuit 110 which is configured to be inputted with complementary input signals IN and INB; and output differential output signals OUT and OUTB swinging in a CML area and a first control signal PD, in response to a power-down mode signal PWDN.

The differential output signals OUT and OUTB outputted from the mode control circuit 110 may be provided to a first circuit unit 120 which continuously operates in a power-down mode; and a second circuit unit 130 of which operation is interrupted in the power-down mode. The first control signal PD is provided to the second circuit unit 130 and interrupts the operation of the second circuit unit 130 in the power-down mode.

The mode control circuit 110 may include a control signal generation unit 112 and a CML circuit unit 114.

The control signal generation unit 112 is configured to output the first control signal PD and a second control signal PDCON in response to an operation enable signal EN and the power-down mode signal PWDN.

The CML circuit unit 114 is configured to generate the differential output signals OUT and OUTB which swing between a highest potential level and a lowest potential level as designated potential levels, in response to the complementary input signals IN and INB, the operation enable signal EN and the second control signal PDCON.

In the power-down mode, since the CML circuit unit 114 is controlled by the second control signal PDCON, the differential output signals OUT and OUTB may be generated with reduced current consumption.

The current consumption amount of the CML circuit unit 114 is proportional to an amount of current sunken from the common node of input terminals to which complementary input signals are respectively inputted, to a ground terminal. In an embodiment, a sink current amount is reduced by the second control signal PDCON generated according to the power-down mode signal PWDN, and thus, a consumption amount of power may be reduced.

The swing width of the differential output signals OUT and OUTB generated in the CML circuit unit 114 is proportional to a resistance component which controls an amount of current flowing from the terminal of a power supply voltage to an output node; and the amount of current sunken from the common node of the input terminals in which complementary input signals are respectively inputted, to the ground terminal. The CML circuit unit may be configured to control an amount of current applied to an output node in proportion to the controlled amount of sink current. Therefore, it is possible to increase a resistance component for controlling an amount of current flowing to the output node, by a degree to which a sink current amount is reduced to constantly retain the swing width of the differential output signals OUT and OUTB. This can occur regardless of whether or not it is the power-down mode.

The qualities of the differential output signals OUT and OUTB generated in the power-down mode does not need to be of the same quality as the qualities of the differential output signals OUT and OUTB generated in a normal mode. Accordingly, by reducing a sink current amount, power consumption in the power-down mode may be significantly reduced.

Figure 4:
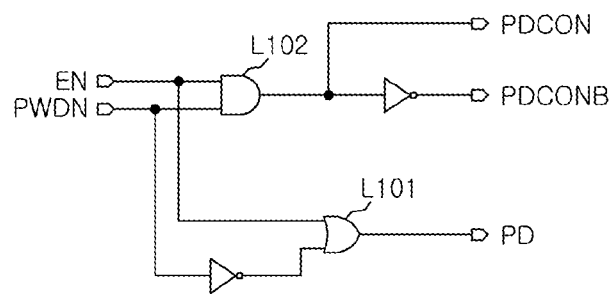
FIG. 4 is a diagram of an embodiment of the control signal generation unit shown in FIG. 3.

FIG. 4 is a diagram of an embodiment of the control signal generation unit shown in FIG. 3.

The control signal generation unit 112 shown in FIG. 4 may include a first element L101 configured to generate the first control signal PD in response to the operation enable signal EN and an inverted signal of the power-down mode signals PWDN; and a second element L102 configured to generate the second control signal PDCON and its inverted signal PDCONB in response to the operation enable signal EN and the power-down mode signal PWDN.

The first element L101 is configured to enable the first control signal PD when the power-down mode signal PWDN is enabled, in response to the power-down mode signal PWDN enabled to a low level in the power-down mode, and the operation enable signal EN.

The second element L102 is configured to enable the second control signal PDCON to a low level when the power-down mode signal PWDN is enabled.

Figure 5:
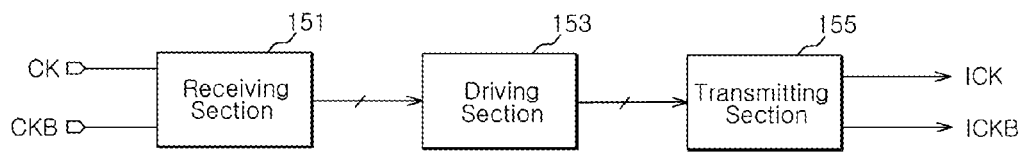
FIG. 5 is a diagram of an embodiment of a clock generation unit.

The CML circuit unit 114 which is able to regulate a current consumption amount according to the power-down mode may be, for example, a clock generation unit. An example of the clock generation unit is shown in FIG. 5.

A clock generation unit 150 may include a receiving section 151, a driving section 153 and a transmitting section 155.

The receiving section 151 may be a clock buffer which is provided with complementary clock signals CK and CKB. The complementary clock signals CK and CKB may be provided from a clock pad or may be clock signals which are generated by changing the frequency of an internal clock.

The driving section 153 may amplify the clock signals outputted from the receiving section 151 and output the amplified clock signals.

The transmitting section 155 is disposed between circuit units which are to use clock signals, for example, the first and second circuit units 120 and 130 of FIG. 3, and the driving section 153, and repeat the amplified clock signals. The clock signals which are outputted from the transmitting section 155 may be referred to as differential internal clock signals ICK and ICKB.

The clock generation unit 150 drives and divides the clock signals as high frequency signals, and may be constituted by a CML circuit to drive and divide the clock signals without influence by noise. Furthermore, because the clock generation unit 150 consecutively generates the clock signals even in the power-down mode, an amount of current consumption increases.

Therefore, by configuring the internal component elements of the clock generation unit 150, for example, the driving section 153 or the transmitting section 155 to be controlled by the second control signal PDCON generated by the power-down mode signal PWDN as shown in FIGS. 3 and 4, sink current may be reduced. The power consumption of the clock generation unit 150 in the power-down mode may be remarkably reduced.

Figure 6:
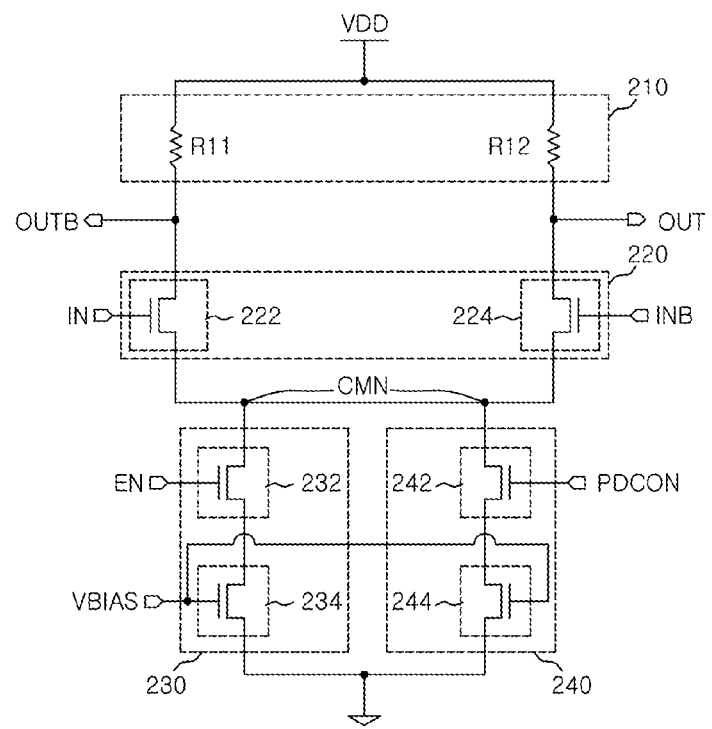
FIG. 6 is a diagram of an embodiment of a CML circuit unit.

FIG. 6 is a diagram of an embodiment of a CML circuit unit.

A CML circuit unit 200 shown in FIG. 6 may include a swing width control section 210, an input section 220, a first current control section 230, and a second current control section 240.

The swing width control section 210 may include a first resistor element R11 electrically coupled between the terminal of a power supply voltage VDD and a first output node to which a first output signal OUTB is applied; and a second resistor element R12 electrically coupled between the terminal of the power supply voltage VDD and a second output node to which a second output signal OUT is applied; to allow the differential output signals OUT and OUTB to swing between designated potential levels. Therefore, the first resistor element R11 and the second resistor element R12, which constitute the swing width control section 210, may be configured to have the same resistance value.

The input section 220 is configured to be provided with a first input signal IN between the first output node and a common node CMN, and be provided with a second input signal INB between the second output node and the common node CMN. That is to say, the input section 220 may include a first input part 222 which is provided with the first input signal IN; and a second input part 224 which is provided with the second input signal INB complementary to the first input signal IN.

The first current control section 230 is configured to be electrically coupled between the common node CMN and a ground terminal VSS; and determine an amount of current to be sunken through the CML circuit unit 200 in a power-down mode in response to an operation enable signal EN and a bias voltage VBIAS. In detail, the first current control section 230 may include a first switching part 232 which enables the CML circuit unit 200 in response to the operation enable signal EN; and a third switching part 234 which provides sink current to the ground terminal VSS in response to the bias voltage VBIAS. The first switching part 232 may determine an amount of current to be sunken through the CML circuit unit 114 in the power-down mode in response to the operation enable signal EN. The third switching part 234 may be configured to be electrically coupled between the first current control section 230 and the ground terminal VSS and be driven by the bias voltage VBIAS.

The second current control section 240 is configured to be electrically coupled between the common node CMN and the ground terminal VSS; and determine an amount of current to be sunken through the CML circuit unit 200 in the normal mode in response to a second control signal PDCON and the bias voltage VBIAS. The second current control section 240 may include a second switching part 242 which is electrically coupled to the common node CMN; and interrupts a current path from the common node CMN when the second control signal PDCON is activated to a low level. In the power-down mode, and a fourth switching part 244 which is electrically coupled between the second switching part 242 and the ground terminal VSS and is driven by the bias voltage VBIAS. The second switching part 242 may determine an amount of current to be sunken through the CML circuit unit 114 in a normal mode in response to the second control signal PDCON. The second current control section 240 may be driven in response to the second control signal PDCON.

Since the second control signal PDCON is enabled to the low level by the control signal generation unit 112 of FIG. 4 in the power-down mode, the second switching part 242 is turned off. Accordingly, by designing the resistance value of the first switching part 232 to be greater than the resistance value of the second switching part 242, an amount of current to be sunken to the ground terminal VSS in the power-down mode may be reduced.

Although it is shown in FIG. 6 that the first current control section 230 and the second current control section 240 respectively include the third switching part 234 and the fourth switching part 244, the first current control section 230 and the second current control section 240 may not be limited as such. That is to say, it is possible that the source terminals of the first switching part 232 and the second switching part 242 are electrically coupled to be a common source terminal; and a single switching part is realized between the common source terminal and the ground terminal VSS to be driven by the bias voltage VBIAS.

Figure 7:
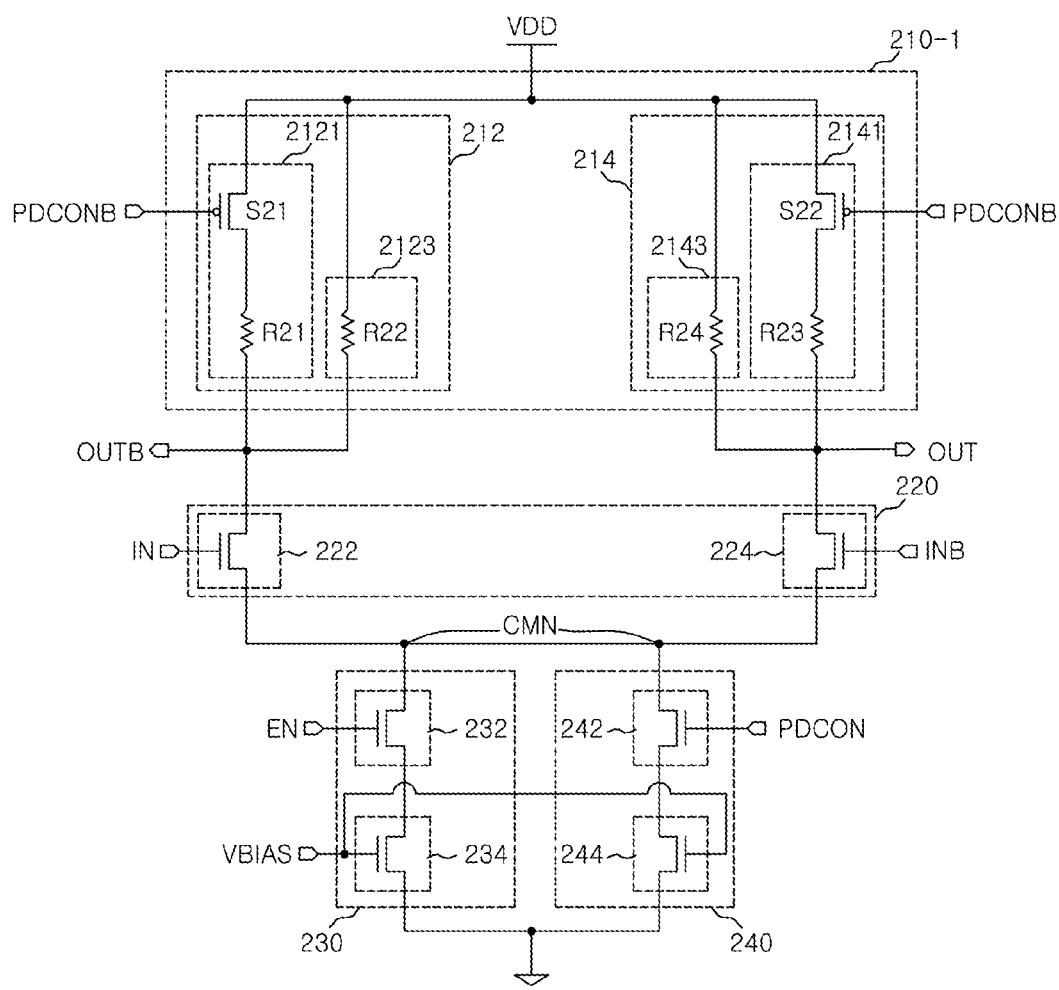
FIG. 7 is a diagram of an embodiment of a CML circuit unit.

Referring to FIG. 7, a CML circuit unit 200-1 shown in FIG. 7 may include a swing width control section 210-1, the input section 220, the first current control section 230 and the second current control section 240. Since the CML circuit unit 200-1 according to an embodiment has substantially the same structure as the CML circuit unit 200 shown in FIG. 6 except the swing width control section 210-1, only the swing width control section 210-1 will be described below in detail.

The swing width control section 210-1 according to an embodiment may include a first swing width controller 212 and a second swing width controller 214.

The first swing width controller 212 is configured to be electrically coupled between the terminal of the power supply voltage VDD and a first output node to which a first output signal OUTB is applied; and control the current path between the terminal of the power supply voltage VDD and the first output node in response to a second control signal PDCONB generated from a power-down mode signal PWDN.

The second swing width controller 214 is configured to be electrically coupled between the terminal of the power supply voltage VDD and a second output node to which a second output signal OUT is applied; and control the current path between the terminal of the power supply voltage VDD and the second output node in response to the second control signal PDCONB generated from the power-down mode signal PWDN.

In an embodiment, the first swing width controller 212 may include a first path control part 2121 which is electrically coupled between the terminal of the power supply voltage VDD and the first output node; and forms a first current path in response to the second control signal PDCONB, and a second path control part 2123 which is electrically coupled in parallel to the first path control part 2121. The first path control part 2121 may include a fifth switching part S21 which is electrically coupled to the terminal of the power supply voltage VDD and is driven in response to the second control signal PDCONB; and a third resistor element R21 which is electrically coupled between the fifth switching part S21 and the first output node. The second path control part 2123 may include a forth resistor element R22 which is electrically coupled between the terminal of the power supply voltage VDD and the first output node. The resistance by the second path control part 2123 may be configured to be greater than the resistance of the first path control part 2121.

The second swing width controller 214 may include a third path control part 2141 which is electrically coupled between the terminal of the power supply voltage VDD and the second output node and forms a second current path in response to the second control signal PDCONB; and a forth path control part 2143 which is electrically coupled in parallel to the third path control part 2141. The third path control part 2141 may include a sixth switching part S22 which is electrically coupled to the terminal of the power supply voltage VDD and is driven in response to the second control signal PDCONB; and a fifth resistor element R23 which is electrically coupled between the sixth switching part S22 and the second output node. The forth path control part 2143 may include a sixth resistor element R24 which is electrically coupled between the terminal of the power supply voltage VDD and the second output node.

In an embodiment, the forth resistor element R22 may be designed to have a resistance value greater than that generated by the fifth switching part S21 and the third resistor element R21. The sixth resistor element R24 may be designed to have a resistance value greater than that generated by the sixth switching part S22 and the fifth resistor element R23. The forth resistor element R22 and the sixth resistor element R24 may be designed to have the same size so as to have the same resistance value; the third resistor element R21 and the fifth resistor element R23 may be designed to have the same size so as to have the same resistance value; and the fifth switching part S21 and the sixth switching part S22 may be formed to have the same size so as to have the same resistance value.

Accordingly, in the normal mode, since the second control signal PDCONB has the low level, current flows through first and third path control parts 2121 and 2141; and, in the power-down mode, since the second control signal PDCONB has a high level, current flows through second and forth path control parts 2123 and 2143. In other words, the resistance value of the swing width control section 210-1 in the power-down mode may be controlled to be larger than that in the normal mode.

As described above with reference to FIG. 6, since the second control signal PDCONB is enabled to the low level by the control signal generation unit 112 of FIG. 4 in the power-down mode, the second switching part 242 of the second current control section 240 is turned off and a sink current amount may be reduced.

Since the swing width of differential output signals OUT and OUTB outputted from the CML circuit unit 200-1 is reduced as a sink current amount is reduced, it is necessary to retain the swing width. Accordingly, in the power-down mode, current paths through the first path control part 2121 and the third path control part 2141 which have low resistance values by the second control signal PDCONB are interrupted; and current flows to the respective first and second output nodes through the second path control part 2123 and the forth path control part 2143 which have large resistance values.

As a result, in the power-down mode, the swing width of the differential output signals OUT and OUTB may be retained the same as in the normal mode even while reducing a sink current amount.

Figure 8:
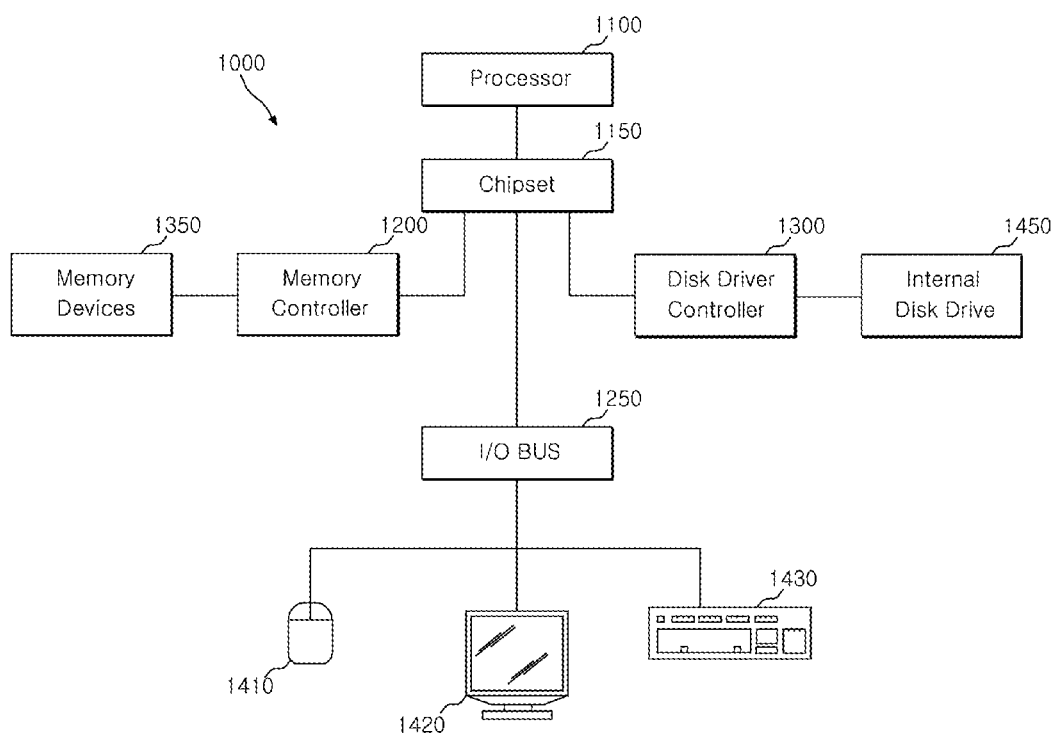
FIG. 8 illustrates a block diagram of a system employing a memory controller circuit.

Referring to FIG. 8, a system 1000 may include one or more processors 1100. The processor 1100 may be used individually or in combination with other processors. A chipset 1150 may be operably coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably coupled to the chipset 1150. The memory controller 1200 can receive a request provided from the processor 1100 through the chipset 1150. The memory controller 1200 may be operably coupled to one or more memory devices 1350. The memory device 1350 may include the semiconductor apparatus 100 described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as a communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
   a mode control circuit configured to output differential output signals which swing in a current mode logic (CML) area and a first control signal, in response to a power-down mode signal;
   a first circuit unit configured to be provided with the differential output signals, and operate in a power-down mode; and
   a second circuit unit configured to be provided with the differential output signals, and be interrupted in its operation in the power-down mode.

2. The semiconductor apparatus according to claim 1, wherein the mode control circuit comprises:
   a control signal generation unit configured to output the first control signal and a second control signal in response to the power-down mode signal; and
   a CML circuit unit configured to generate the differential output signals which swing in the CML area in response to the second control signal.

3. The semiconductor apparatus according to claim 2, wherein the CML circuit unit controls a sink current in response to the second control signal.

4. The semiconductor apparatus according to claim 3, wherein the CML circuit unit controls an amount of current applied to an output node in proportion to a controlled amount of the sink current.

5. The semiconductor apparatus according to claim 2, wherein the control signal generation unit comprises:
   a first element configured to generate the first control signal in response to an operation enable signal and an inverted signal of the power-down mode signal; and
   a second element configured to generate the second control signal and an inverted signal of the second control signal in response to the power-down mode signal.

* * * * *